(12) United States Patent
Mackh et al.

(10) Patent No.: US 9,040,354 B2
(45) Date of Patent: May 26, 2015

(54) CHIP COMPRISING A FILL STRUCTURE

(71) Applicant: Infineon Technologies AG, Neubiberg (DE)

(72) Inventors: Gunther Mackh, Neumarkt (DE); Gerhard Leschik, Regensburg (DE); Adolf Koller, Regensburg (DE); Harald Seidl, Poering (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/184,856

(22) Filed: Feb. 20, 2014

(65) Prior Publication Data

US 2014/0170836 A1 Jun. 19, 2014

Related U.S. Application Data

(62) Division of application No. 13/247,162, filed on Sep. 28, 2011, now Pat. No. 8,704,338.

(51) Int. Cl.
| | |
|---|---|
| *H01L 21/78* | (2006.01) |
| *H01L 23/58* | (2006.01) |
| *H01L 21/82* | (2006.01) |
| *G06F 17/50* | (2006.01) |

(52) U.S. Cl.
CPC ............... *H01L 21/78* (2013.01); *H01L 21/82* (2013.01); *G06F 17/5068* (2013.01); *H01L 23/585* (2013.01); *H01L 2924/0002* (2013.01)

(58) Field of Classification Search
CPC ..... H01L 23/544; H01L 23/585; H01L 21/78; H01L 21/304; H01L 21/7806; H01L 21/784; H01L 21/786; H01L 21/82

USPC .......................................... 257/620; 438/113
See application file for complete search history.

(56) References Cited

U.S. PATENT DOCUMENTS

| | | | | |
|---|---|---|---|---|
| 6,479,887 | B1 * | 11/2002 | Yoon et al. | ..................... 257/666 |
| 6,521,975 | B1 * | 2/2003 | West et al. | ..................... 257/620 |
| 2008/0064186 | A1 | 3/2008 | Imori | |
| 2010/0123219 | A1 * | 5/2010 | Chen et al. | ..................... 257/620 |
| 2010/0148314 | A1 * | 6/2010 | Han | ............................. 257/620 |
| 2010/0155582 | A1 | 6/2010 | Hirano et al. | |
| 2010/0193918 | A1 | 8/2010 | West et al. | |
| 2010/0207250 | A1 | 8/2010 | Su et al. | |
| 2010/0207251 | A1 | 8/2010 | Yu et al. | |
| 2010/0213594 | A1 * | 8/2010 | Higashino et al. | ............. 257/686 |
| 2010/0258539 | A1 * | 10/2010 | Sakamoto | ................ 219/121.62 |
| 2010/0283128 | A1 | 11/2010 | Chen | |
| 2011/0057297 | A1 | 3/2011 | Lee et al. | |
| 2011/0124180 | A1 | 5/2011 | Abe et al. | |
| 2011/0156219 | A1 | 6/2011 | Kawashima et al. | |
| 2011/0241177 | A1 | 10/2011 | Eto | |
| 2011/0241178 | A1 | 10/2011 | Miki | |
| 2011/0266657 | A1 | 11/2011 | Chibahara et al. | |
| 2011/0298095 | A1 | 12/2011 | Daubenspeck et al. | |

FOREIGN PATENT DOCUMENTS

JP         2006222258 A      6/2006

* cited by examiner

*Primary Examiner* — Nathan Ha
(74) *Attorney, Agent, or Firm* — Slater & Matsil, L.L.P.

(57) ABSTRACT

A chip includes a dielectric layer and a fill structure in the dielectric layer, wherein the fill structure extends along a dicing edge of the chip, with the fill structure abutting the dicing edge.

28 Claims, 5 Drawing Sheets

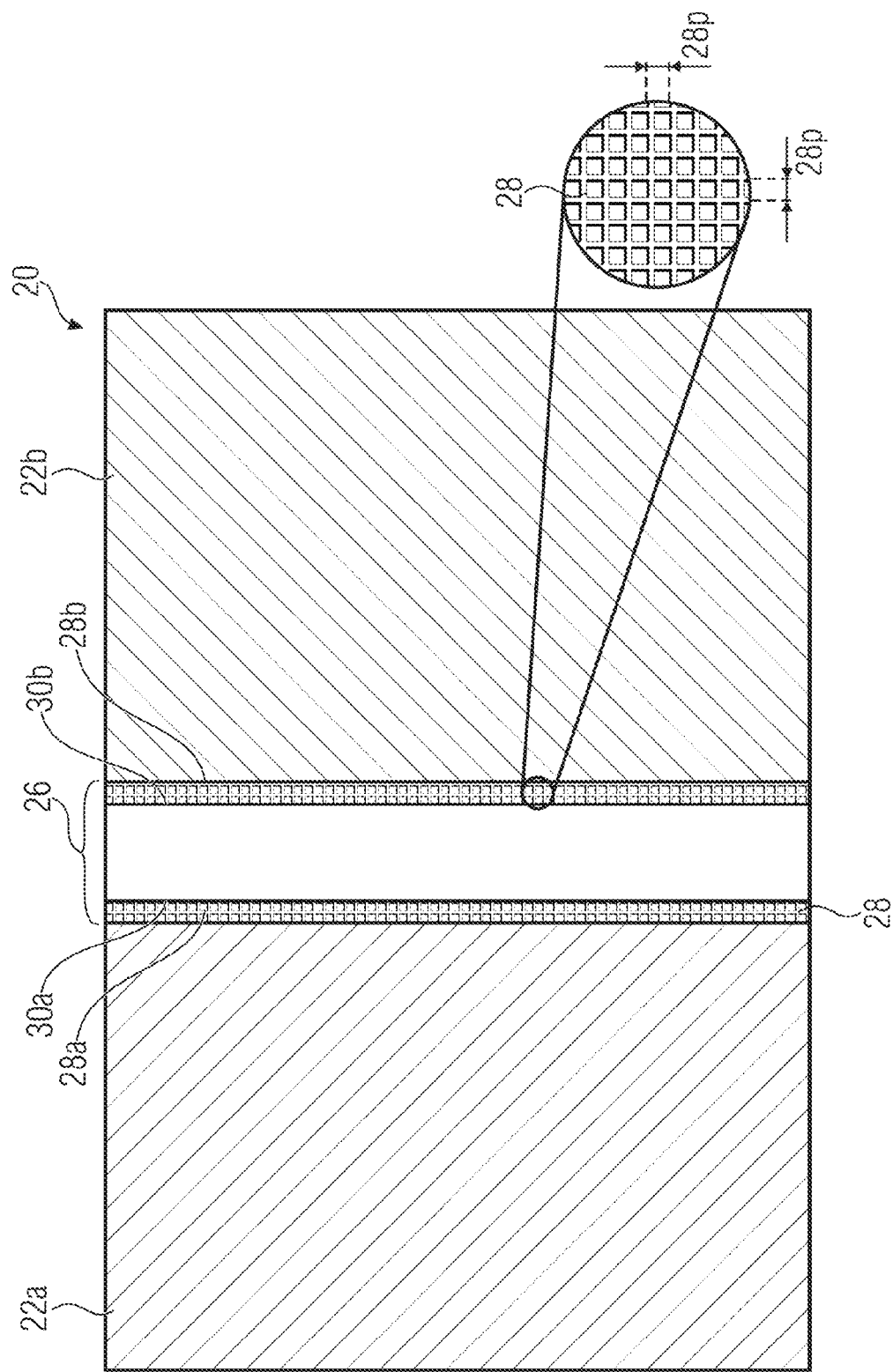

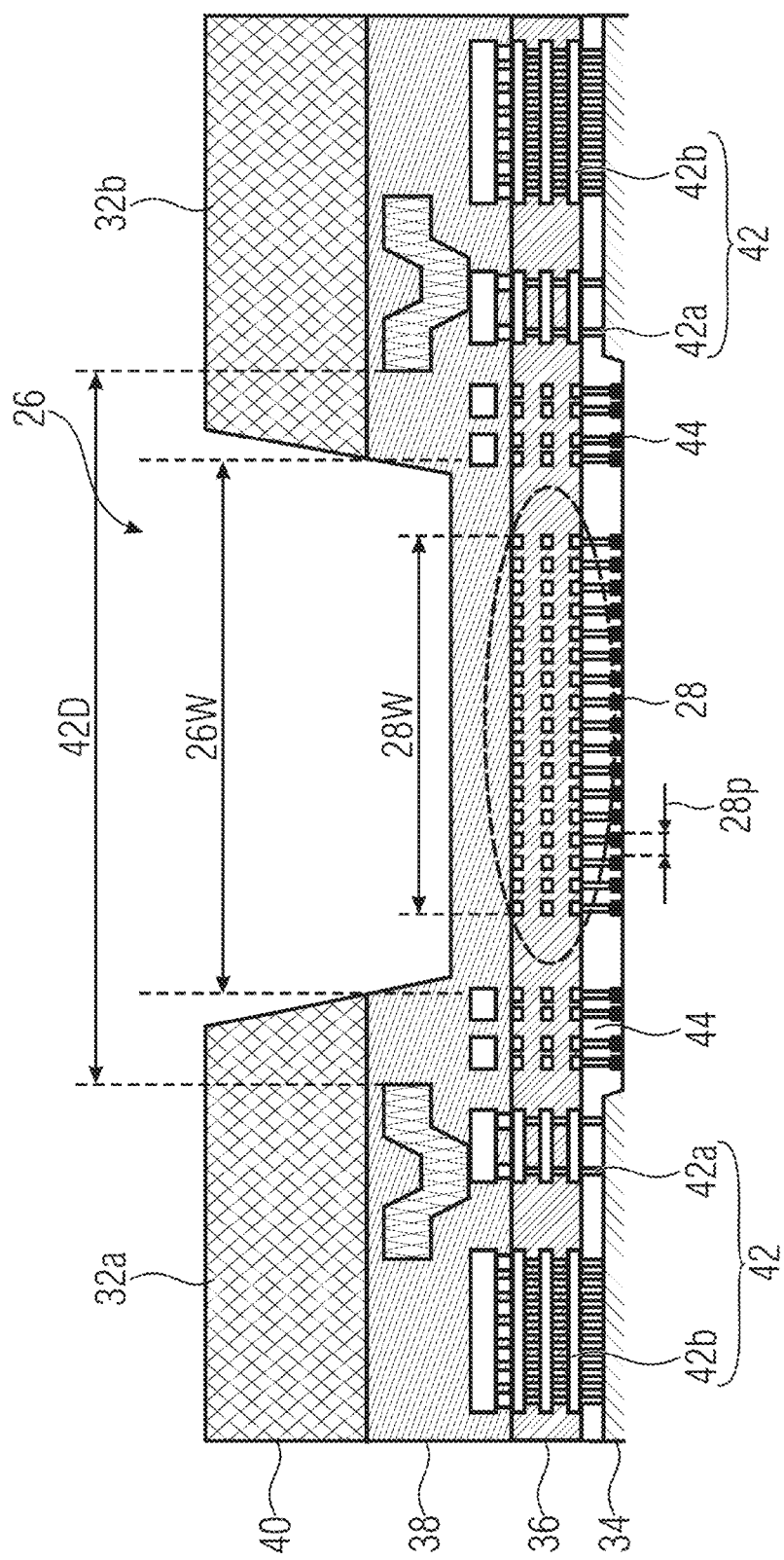

CHIP COMPRISING A FILL STRUCTURE

This application is a divisional of U.S. application Ser. No. 13/247,162, filed on Sep. 28, 2011, which application is hereby incorporated herein by reference.

TECHNICAL FIELD

Embodiments of the invention refer to a chip comprising a fill structure, to a wafer comprising a plurality of chips which comprise a fill structure, to a method for manufacturing a plurality of chips and to a computer program for providing a layout of a periodic fill structure.

BACKGROUND

The design of a chip, a size of which is usually between 1 mm$^2$ and 50 mm$^2$, is defined by its layout. During manufacturing, the chip layout is patterned onto a wafer, a size of which is usually considerably larger than the size of the chip. This enables producing several chips in parallel by using one wafer. Therefore, several chip layouts are patterned side by side onto the wafer. As a result of this, a plurality of chip areas separated by a scribe line, also referred to as a dicing line, is generated. The wafer is cut or diced in order to singulate the chips for further manufacturing. This can, for example, be done by using a saw or by using stealth dicing.

SUMMARY OF THE INVENTION

Embodiments of the invention provide a chip comprising a dielectric layer and a fill structure in the dielectric layer, wherein the fill structure extends along a dicing edge of the chip, with the fill structure abutting the dicing edge.

Further embodiments of the invention provide a wafer comprising a plurality of chip areas separated by at least a dicing line, wherein the wafer comprises a dielectric layer. The dielectric layer comprises a fill structure within the dicing line, a width of which is smaller than 100 µm or even smaller than 25 µm.

Further embodiments of the invention provide a method for manufacturing a plurality of chips. The method comprises the first step of providing a wafer comprising a dielectric layer, wherein the wafer comprises a fill structure of the dielectric layer within a dicing line, and a plurality of chip areas separated by at least the dicing line. The method further comprises the second step of singulating the chips along the dicing line.

Another embodiment of the invention provides a computer readable digital storage medium having stored thereon a computer program having a program code for performing, when running on a computer, a method for providing a layout of a wafer. The method comprises the first step of providing at least two chip layouts and the second step of arranging the two chip layouts within a common layout of the wafer so that a dicing line is defined between two chip layouts. The method further comprises the third step of automatically providing a layout of a periodic fill structure within the dicing line.

BRIEF DESCRIPTION OF THE DRAWINGS

In the following, embodiments of the invention will be described referring to the drawings.

FIG. 1B schematically shows a top view of straight dicing edges caused by singulating two chips comprising a dielectric layer and a fill structure according to an embodiment;

FIG. 2 shows a schematic cross-sectional view of two chip areas of a wafer and a dicing line in between comprising a fill structure according to an embodiment;

DETAILED DESCRIPTION OF ILLUSTRATIVE EMBODIMENTS

Figure 1A:
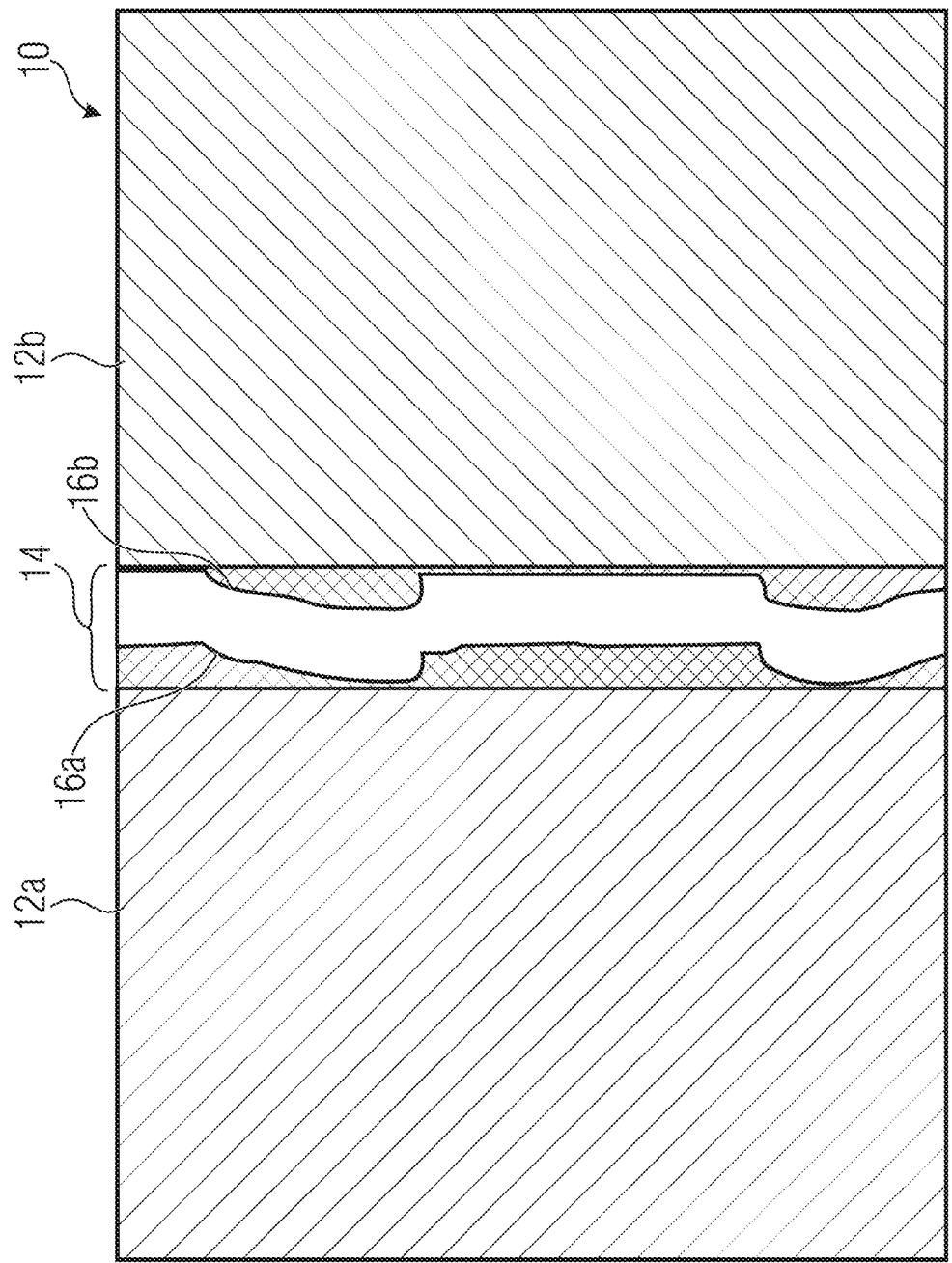
FIG. 1A schematically shows a top view of non-straight dicing edges caused by singulating two chips comprising a dielectric layer without a fill structure.

Different embodiments of the invention will subsequently be discussed referring to FIG. 1 to FIG. 3. In the drawings, identical reference numerals are provided to objects having identical or similar functions so that objects referred to by identical reference numerals within the different embodiments are interchangeable and the description thereof is mutually applicable.

Stealth dicing is a singulating or cutting method for chips patterned on a wafer. The singulation of chips cause a cutting scrap of the wafer between the singulated chips. Therefore, in a layout, chip areas are arranged or distributed across the wafer with dicing lines there between. Dicing lines represent a line, stripe or area between the chip areas which is sacrificed for the singulation. Dicing lines of a wafer which should be cut by stealth dicing are significantly thinner than dicing lines of a wafer which should be cut by an alternative singulation method. This saves space on the wafer and enables increasing the number of chips per wafer. The potential space saving depends on the number of dicing lines and thus on the number of chips per wafer. Therefore, stealth dicing is predestinated for small chips, e.g., smaller than 10 mm$^2$. In summary, it can be stated that stealth dicing may lead to cost saving. Furthermore, stealth dicing enables high quality of a dicing edge of a singulated chip. Stealth dicing is typically used for fabricating chips based on a technology which is larger than the 65 nm technology. The background is that chips based on the 65 nm technology or based on a smaller technology often comprise so-called low-k or ultra-low-k dielectrics. Stealth dicing in the combination with such dielectrics often causes non-straight dicing edges of the chips, chippings and/or delaminations of a dielectric layer. Such chippings or delaminations may cause reliability problems or further problems during the assembly process or packaging process.

Referring to FIG. 1A and FIG. 1B, an improved approach for a singulation of a plurality of chips patterned on a wafer comprising low-k dielectrics will be discussed. FIG. 1A shows a top view onto two chip areas of a wafer cut along a dicing line, wherein dicing edges are non-straight. FIG. 1B shows a top view onto two chip areas of a wafer comprising a fill structure extending along a dicing line, wherein the two chip areas are cut along the dicing line and wherein the dicing edges of the chips are straight.

FIG. 1A shows a wafer 10, e.g., a silicon substrate, comprising two chip areas 12a and 12b of two chips. The two chips 12a and 12b (or chip areas 12a and 12b) may comprise a logic element, an integrated circuit and/or a passive component, such as a diode, formed in different layers. The wafer 10 comprises a dielectric layer (not shown). This dielectric layer may comprise low-k dielectrics (dielectric constant smaller than 3.9) or ultra-low-k dielectrics (dielectric constant smaller than 2.4). Regarding material properties, such low-k-dielectrics and ultra-low-k-dielectrics are brittle and tend to chipping and delaminating.

The two chip areas 12a and 12b are cut along a dicing line 14 to singulate the chips 12a and 12b of the wafer 10. The singulation of the two chips or chip areas 12a and 12b may be performed by stealth dicing. Due to the singulation of the two chips 12a and 12b two dicing edge, namely a dicing edge 16a of a chip 12a and a dicing edge 16b of a chip 12b, are generated. The dicing edges 16a and 16b are substantially in parallel with the dicing line 14 and lie within the same. Due to the brittle dielectric layer, the two dicing edges 16a and 16b are non-straight or saw-toothed and show chippings. It should be noted that the non-straight dicing edges 16a and 16b occur only in the dielectric layer, not in the wafer 10. These non-straight dicing edges 16a and 16b may cause delaminations of the dielectric layer during further assembly. Thus, there is a need for an improved approach which will be discussed in FIG. 1b.

FIG. 1B shows a wafer 20 which comprises two chip areas 22a and 22b and a dielectric layer (not shown). The dielectric layer of the two chips 22a and 22b as well as the two chips 22a and 22b correspond to the dielectric layer of FIG. 1a and to the two chips 12a, 12b shown in FIG. 1a, respectively. The dielectric layer of the wafer 20 and thus the two chips 22a and 22b comprise a fill structure 28 within a dicing line 26.

The two chip areas 22a and 22b (chips 22a and 22b) are cut along the dicing line 26. This singulation may be performed by stealth dicing. A dicing edge 30a of the chip 22a and a dicing edge 30b of the chip 22b are parallel to the dicing line 26 and straight. Background thereon is that the two chips 22a and 22b are cut by a rectilinear breaking edge which advances along the fill structure 28. In other words, the fracture propagation through the wafer and the dielectric layer is directed by the fill structure 28. Therefore, the risk of chipping and delaminations of the dielectric layer is reduced.

The fill structure 28 is divided into two parts after cutting or singulating the two chips 22a and 22b. Therefore, a part of the fill structure 28a also extends along the dicing edge 30a of the chip 22a and a part of the fill structure 28b extends along the dicing edge 30b of the chip 22b such that the fill structures 28a and 28b abut the dicing edges 30a and 30b. It is advantageous that the breaking behavior during stealth dicing of the wafer 20 and thus the reliability of the chips 22a and 22b can be significantly improved due to the provided fill structure 28. Therefore, it is advantageous that stealth dicing may be used for the singulation of the chips 22a and 22b comprising low-k or ultra-low-k dielectrics which are typically used for chips in which an average half-pitch of the chip is equal or smaller than 65 nm (e.g., 45 nm). Providing the fill structure 28 does not cause additional costs or enlarge the dicing line 26.

According to another embodiment, the fill structure 28 may comprise metal, oxide or polysilicon. The fill structure 28 forms a periodic structure in the lateral dimension parallel to the dicing line 26 and perpendicular to the dicing line 26. In this embodiment, the periodic structure has a periodicity with a periodic pitch 28p which is smaller than 1 µm (see zoom shot of the fill structure 28). In general, the periodicity is smaller than 20 µm or even smaller than 5 µm. It should be noted that the dimensions referring to the dicing line 26 also refer to the dicing edges 30a and 30b after the singulation of the chips 22a and 22b. According to another embodiment, the dicing edges 30a and 30b are abutted by the fill structure 28 along an entire length of the dicing edge 30a or 30b, wherein each chip 22a or 22b comprises four dicing edges 30a or 30b at the four sides of the rectangle chip 22a or 22b.

Referring to FIG. 2 the structure of the fill structure within the dicing line of a wafer and along the dicing edge of a chip (after cutting the wafer) will be discussed in detail. FIG. 2 shows a cross-sectional view through a wafer 34 comprising at least two chip areas 32a or 32b and through a fill structure 28 within the dicing line 26 of the wafer 34. The dicing line 26 separates the two chip areas 32a and 32b.

The wafer 34 or substrate 34 comprises a dielectric layer 36. Within the dielectric layer 36 at the chip areas 32a and 32b there are some active chip areas 42, such as long holes 42a and interconnecting lines 42b for connecting logic elements of the chip area 32a or 32b (and of a chip 32a or 32b, respectively). On the dielectric layer 36 a passivation layer 38 and an imide layer 40 is arranged. Within the dicing line 26 the imide layer 40 and the passivation layer 38 comprise a trench such that a thickness within the dicing line 26 is reduced when compared to a thickness at the chip areas 32a and 32b.

Within the dicing line 26 the fill structure 28 is formed by a (periodic) grid of polysilicon vias or metal vias or metal conductor line fragments. In other words, the fill structure 28 comprises a plurality of fill structure elements which are periodically arranged in a lateral dimension with the periodic pitch 28p as discussed in FIG. 1B. In this embodiment, each fill structure element has a shape of a cube and the sizes of the fill structure elements of the fill structure 28 correspond to a half of the periodic pitch 28p. The metal vias or separated metal conductor line fragments are formed in the dielectric layer 36 contemporaneously with the interconnecting lines 42b of the chip areas 32a or 32b. Therefore, the material and a height of the fill structure elements are dependent on a material of the interconnecting lines 42b and a thickness of the layer in which the interconnecting lines 42b are formed. In this embodiment, the fill structure 28 is formed by three stacked metal layers extended within the dielectric layer 36. The plurality of these layers may have a periodicity which may increase from a lower layer to an upper layer depending on the chip layout.

In this embodiment, a distance 42D between the two active areas 42 of the two chips 32a and 32b is 20 µm and the width 26W of the dicing line 26 is 16 µm. The dicing line 26 is centered with respect to the two active areas 42 such that a distance of 2 µm between the respective active area 42 and the dicing line 26 is generated. The fill structure 28 has a width 28W of 12 µm such that the fill structure 28 is placed in the middle of the dicing line 26 and has a lateral distance of 2 µm at each side to a edge of the dicing line 26. Therefore, the fill structure 28 laterally occupies more than 25% and even more than 50% of the width 26W of the dicing line 26. Referring to the volume of the fill structure 28, the fill structure 28 comprises a density of metal, oxide or polysilicon of at least 10% or even 30% or 50%. This value refers to a volume enclosed by the fill structure 28 in the dielectric layer 36. The volume of the fill structure 28 is defined by the width 28W and a length of the fill structure 28 as well as by a height of the fill structure (with reference to a direction of a thickness of the layers).

According to another embodiment, the chip 32a or 32b may comprise a sealing ring 44, which extends in parallel to the dicing line 26 and the dicing edges of the singulated chip, respectively, within the dielectric layer 36. The sealing ring 44 is arranged between the active structure 42 and the fill structure 28, at a distance, e.g., 2 µm, from the fill structure 28 and a distance from the active structure 42. After the singulation the sealing ring 44 is spaced to the dicing edge of the chip 32a or 32b. The sealing ring 44 may have a similar structure to the fill structure 28 and may also be provided contemporaneously with the fill structure 28. The sealing ring 44 has the purpose to avoid chipping and delaminations of the dielectric layer 36.

Figure 3A:
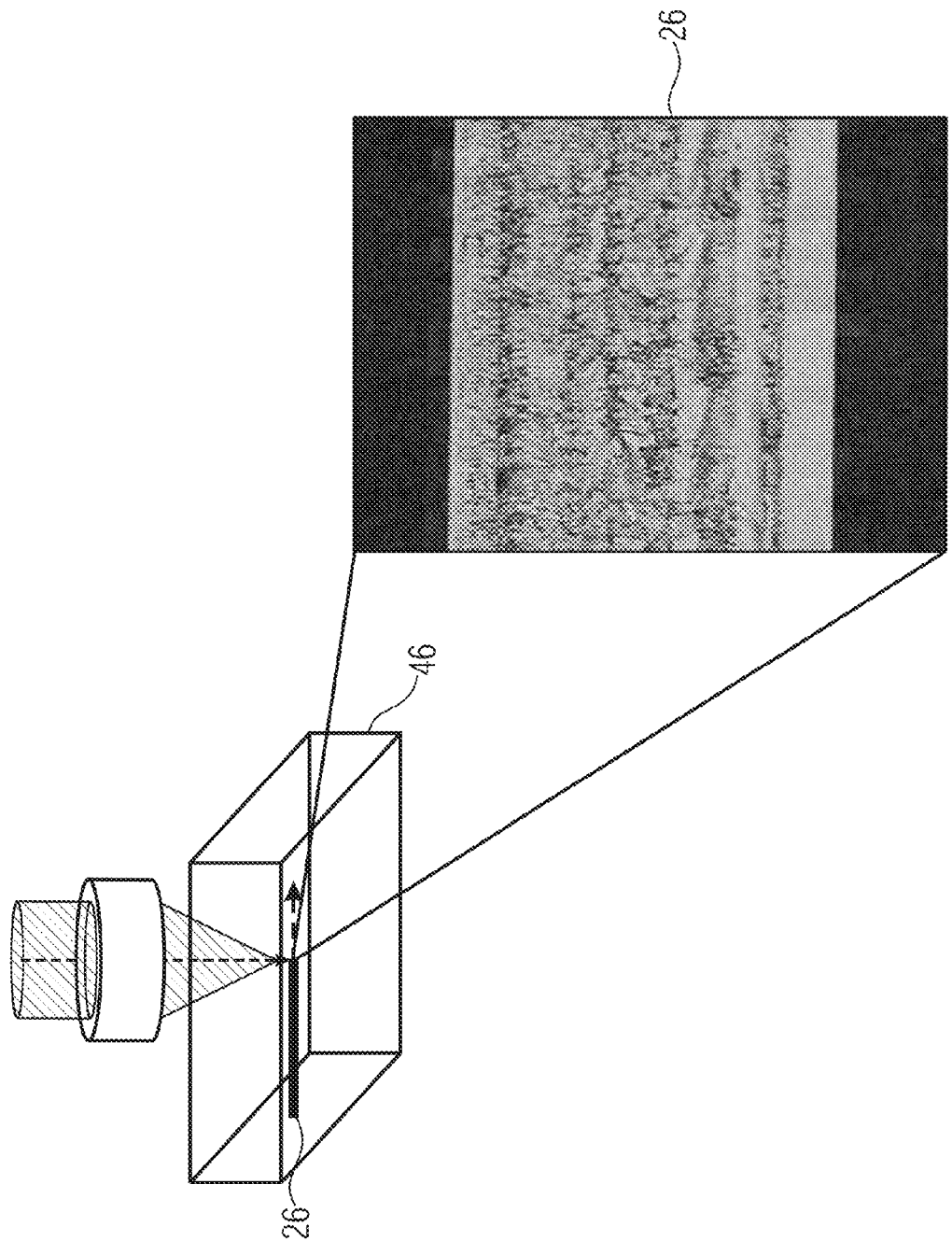
FIG. 3A schematically illustrates an early step of the method "stealth dicing" according to an embodiment.
Figure 3B:
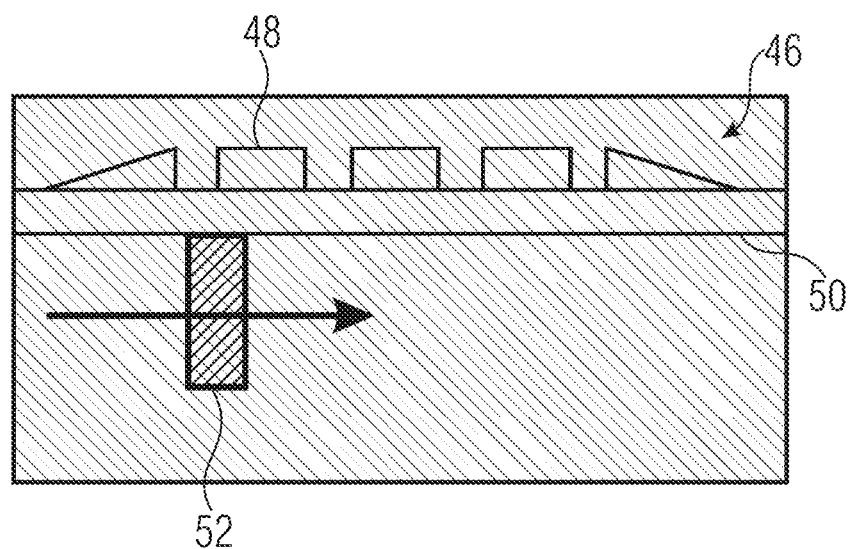
FIG. 3B schematically illustrates a step of the method "stealth dicing" subsequent to the step illustrated in FIG. 3A.

Referring to FIG. 3A and FIG. 3B, a method of manufacturing a plurality of chips and especially a method of singulating the plurality of chips will be discussed. FIG. 3A illustrates an early step of this method after the wafer 46 and the dielectric layer as well as the layout of the plurality of chip areas separated by at least the dicing line 26 which includes the fill structure 28 has been provided. The next step is singulating the chips along the dicing line 26 by stealth dicing. Stealth dicing enables that the width of the dicing line 26, which is typically smaller than 25 μm or 20 μm, may be reduced compared to conventional singulation method, e.g., using a sawing blade (e.g., width of 30 to 50 μm). Therefore, stealth dicing has the purpose to save space on the wafer 46 and thus stealth dicing is particularly suitable for small chips and chip areas which are typically smaller than 15 mm² or even smaller than 3 mm² or 2 mm². In this embodiment, the step of singulating is performed by using stealth dicing, which is a two stage process. The first substep is directing a laser beam onto a wafer 46 as illustrated by FIG. 3A and the second substep is expansion and breaking the wafer 46 as illustrated in FIG. 3B.

FIG. 3A schematically illustrates the substep of directing the laser beam onto a first main surface opposing a layer stack of the wafer 46 and scanning the laser beam along the dicing line 26 in order to modify the material and introduce defect regions into the wafer 46. The laser is, for example, a YAG laser that has a wavelength between 1000 nm and 1400 nm, which is adapted to the band gap of the silicon wafer 46. Depending on a thickness of the wafer 46, one or more scans of the laser beam along the same dicing line 26 may be performed in order to focus at different depths of the wafer 46, wherein each laser scan may modify the material within a depth of 50 to 100 μm. Along these dicing lines 26 comprising the modified material the wafer 46 can be broken in order to singulate the chip areas and the chips, respectively.

FIG. 3B schematically illustrates the second substep of expanding and breaking the wafer 46 in order to singulate the three chips 48. Here, the wafer 46 is attached to a (front side of a) carrier membrane 50 with the first main surface of the wafer 46. At this first main surface the fracturing of the wafer 46 is initiated and advances to an opposing main surface when the carrier membrane 50 is readily expanded. To initiate the fracturing of the wafer 46 this process may be supported by a slide 52, also referred to as separation pin, which is arranged at a backside of the carrier membrane 50.

Referring to the embodiment of FIG. 2, the fracturing in the dielectric layer advances along the fill structure 28 or along the grid of the fill structure 28 such that the direction of the propagation of the fracturing extends straightly in parallel with the dicing line 26. Therefore, straight dicing edges of the chips 32a and 32b are generated. In other words, due to the fill structure 28 straight dicing edges are propagated through the (low-k) dielectric layer 36 and through the passivation layer 38 without causing problems of chipping and delaminations of the dielectric layer 36.

Although in the above embodiments the fill structure 28 has been described as a grid of separated structure elements, the fill structure 28 may also comprise connected or partly connected structure elements. It should be noted that the size and the shape of the fill structure elements of the fill structure 28 may vary. Furthermore, the fill structure may have different lateral periodic pitches 28p in the dimension parallel to the dicing edges (dicing lines) and in the dimension perpendicular to the dicing edges (dicing lines).

Although in the above embodiments the fill structure 28 is arranged within the dielectric layer 36, it should be noted that the fill structure 28 may also extend through further layers of the chip or of the wafer. Therefore, an insulating layer, e.g., a shallow trench isolation (STI), may also comprise the fill structure 28. This fill structure 28 arranged within the insulating layer may further improve the separation behavior of the chip.

Referring to the embodiments of FIG. 3, it should be noted that the dicing line 26 which is typically smaller than 25 μm in case of using stealth dicing may be larger, e.g., 100 μm. Background thereof is that stealth dicing may be used for thin wafer to improve the quality of the dicing edges, wherein in such cases the dicing line 26 is typically larger (e.g., 25 to 100 μm) compared to other application of stealth dicing as discussed above. In such cases the fill structure 28 within the dicing line may also be beneficial.

Although some aspects have been described in the context of a wafer comprising a fill structure and a chip comprising a fill structure, it is clear that these aspects also represent a description of the corresponding method for manufacturing same, where a block or a device corresponds to a method step or a feature of a method step. Analogously, aspects described in the context of a method step also represent a description of a corresponding block, item or feature of a corresponding apparatus.

Further embodiments of the invention provide a computer readable digital storage medium having stored thereon a computer program having a program code for performing, when running on a computer, a method for providing a layout of a wafer. The wafer layout defines the layout of the singular chips to be patterned onto the wafer as well as a structure, a location and a size of the dicing line and thus also the fill structure and its layout. The method comprises the following steps: the first step is providing at least two chip layouts, wherein the two chip layouts may be similar or different. A second step is arranging the two chip layers within a common layout of the wafer so that a dicing line is defined between the two chip layouts. The last step is automatically providing a layout of a periodic fill structure within a dicing line.

Depending on certain implementation requirements, embodiments of the invention can be implemented in hardware or in software. The implementation can be performed using a digital storage medium, for example, a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier. Other embodiments comprise the computer program for performing one of the methods described herein, stored on a machine readable carrier. In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary. A further embodiment of the inventive method is, therefore, a data stream or a sequence of signals representing the computer program for performing one of the methods described herein. The data stream or the sequence of signals may, for example, be configured to be transferred via a data communication connection, for example, via the Internet.

A further embodiment comprises a processing means, for example, a computer, or a programmable logic device, configured to or adapted to perform one of the methods described herein. A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver. In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method of manufacturing a plurality of chips, the method comprising:
   forming a dielectric layer over a substrate comprising dicing lines for singulating the substrate;
   forming a fill structure having a periodic structure in the dielectric layer, wherein the fill structure is disposed between regions of the substrate comprising the plurality of chips, wherein the periodic structure has a first periodicity with a first periodic pitch in a first lateral direction and having a second periodicity with a second periodic pitch in a second lateral direction perpendicular to the first lateral direction, and wherein a width of each of the dicing lines is less than 100 μm, and wherein the first periodic pitch is less than 20 μm; and
   singulating the substrate through the dicing lines to form the plurality of chips.

2. The method for manufacturing according to claim 1, and wherein a chip area of each of the plurality of chips is less than 10 mm².

3. The method for manufacturing according to claim 1, wherein the first periodic pitch is less than 5 μm.

4. The method for manufacturing according to claim 1, wherein a width of each of the dicing lines is less than 25 μm.

5. The method for manufacturing according to claim 1, wherein the first periodic pitch is the same as the second periodic pitch.

6. The method for manufacturing according to claim 1, wherein the singulating of the substrate is performed by using stealth dicing.

7. The method for manufacturing according to claim 1, wherein the fill structure comprises metal, oxide and/or polysilicon layers.

8. The method for manufacturing according to claim 1, wherein the fill structure comprises a density of metal, oxide, or polysilicon of at least 10%.

9. The method for manufacturing according to claim 1, wherein the fill structure comprises a density of metal, oxide, or polysilicon of at least 50%.

10. The method for manufacturing according to claim 1, wherein the fill structure comprises at least 25% metal.

11. The method for manufacturing according to claim 1, wherein the periodic structure is formed by a grid of metal vias or metal conductor line fragments.

12. The method for manufacturing according to claim 1, wherein the chip comprises a sealing ring which extends in parallel to the dicing lines.

13. The method for manufacturing according to claim 1, wherein the dielectric layer has a dielectric constant smaller than 3.9.

14. The method for manufacturing according to claim 1, wherein average half-pitch of the chip is smaller than 65 nm.

15. The method for manufacturing according to claim 1, wherein the singulating cuts through the periodic structure.

16. A method for manufacturing a plurality of chips, the method comprising:
   providing a wafer comprising a dielectric layer, wherein the wafer comprises a fill structure of the dielectric layer within a dicing line, wherein the fill structure forms a periodic structure, and a plurality of chip areas separated by at least the dicing line, wherein the periodic structure comprises a first periodicity with a first periodic pitch in a first lateral direction and a second periodicity with a second periodic pitch in a second lateral direction perpendicular to the first lateral direction, wherein the first periodic pitch is a different pitch from the second periodic pitch, and wherein the first periodic pitch and the second periodic pitch are both smaller than 5 μm; and
   singulating the plurality of chips along the dicing line.

17. The method for manufacturing according to claim 6, wherein the step of singulating the plurality of chips is performed by using stealth dicing.

18. The method for manufacturing according to claim 16, wherein a width of each of the dicing lines is less than 100 μm.

19. The method for manufacturing according to claim 16, wherein the singulating cuts through the periodic structure.

20. A method for manufacturing a plurality of chips, the method comprising:
   forming a plurality of chip areas separated by at least a dicing line within a wafer;
   forming a dielectric layer over the wafer; and
   forming a fill structure within the dicing line in the dielectric layer, wherein the fill structure forms a periodic structure extending in a lateral dimension parallel and perpendicular to the dicing line, and wherein the fill structure laterally occupies more than 25% of the dicing line, wherein the periodic structure comprises a first periodicity with a first periodic pitch in the lateral direction and a second periodicity with a second periodic pitch in the perpendicular direction, wherein the first periodic pitch is a different pitch from the second periodic pitch.

21. The method for manufacturing according to claim 20, wherein the dicing line having a width smaller than 25 μm.

22. The method for manufacturing according to claim 20, wherein the periodic structure has a periodic pitch smaller than 5 μm.

23. The method for manufacturing according to claim 20, wherein the periodic structure is formed by a grid of metal vias or metal conductor line fragments.

24. The method for manufacturing according to claim 20, wherein the periodic structure is formed by a plurality of metal, oxide and/or polysilicon layers.

25. The method for manufacturing according to claim 20, wherein the fill structure comprises a density of metal of at least 10%.

26. The method for manufacturing according to claim 20, wherein the fill structure comprises a density of metal of at least 50%.

27. The method for manufacturing according to claim 20, wherein the chip areas are smaller than 3 mm$^2$.

28. The method for manufacturing according to claim 20, wherein a width of each of the dicing lines is less than 100 µm.

* * * * *